(12) United States Patent
Oh et al.

(10) Patent No.: US 8,278,206 B2
(45) Date of Patent: Oct. 2, 2012

(54) VARIABLE RESISTANCE MEMORY DEVICE AND METHODS OF FORMING THE SAME

(75) Inventors: Gyuhwan Oh, Hwaseong-si (KR); Dong-Hyun Im, Hwaseong-si (KR); Soonoh Park, Suwon-si (KR); Dongho Ahn, Suwon-si (KR); Young-Lim Park, Hwaseong-si (KR); Eun-Hee Cho, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 373 days.

(21) Appl. No.: 12/608,633

(22) Filed: Oct. 29, 2009

(65) Prior Publication Data

US 2010/0112774 A1 May 6, 2010

(30) Foreign Application Priority Data

Oct. 30, 2008 (KR) .................. 10-2008-0107236

(51) Int. Cl.
*H01C 17/00* (2006.01)
*H01L 27/108* (2006.01)
*H01L 27/11* (2006.01)

(52) U.S. Cl. ........ 438/626; 438/385; 438/634; 438/666; 257/211; 257/E29.141; 257/E21.646

(58) Field of Classification Search .................. 438/385, 438/587, 607–609, 622, 625–626, 631–634, 438/666–672, 674–675; 257/E27.084, E21.646, 257/905, 4, 68, 71, 154, 202, 208, 211, 288, 257/296, 364, 489, 536–538, 773–776, E29.141
See application file for complete search history.

(56) References Cited

U.S. PATENT DOCUMENTS

| 6,376,300 | B1 * | 4/2002 | Chang ........................... 438/246 |
| 7,115,927 | B2 * | 10/2006 | Hideki et al. .................. 257/296 |
| 7,220,983 | B2 | 5/2007 | Lung |

(Continued)

FOREIGN PATENT DOCUMENTS

KR 10-0707182 4/2007

OTHER PUBLICATIONS

English Abstract for Publication No. 10-20060092551.

*Primary Examiner* — Matthew Landau
*Assistant Examiner* — Maliheh Malek
(74) *Attorney, Agent, or Firm* — F. Chau & Associates, LLC

(57) ABSTRACT

A method of forming a memory device includes forming a first interlayer insulating layer on a semiconductor substrate, forming a first electrode in the first interlayer insulating layer, the first electrode having a top surface of a rectangular shape extending in a first direction, and forming a variable resistance pattern on the first electrode, the variable resistance pattern having a bottom surface of a rectangular shape extending in a second direction crossing the first direction, the bottom surface of the variable resistance pattern contacting the first electrode, wherein the area of contact between the lower electrode and the variable resistance pattern is substantially equal to a multiplication of a minor axis length of a top surface of the first electrode and a minor axis length of a bottom surface of the variable resistance pattern.

21 Claims, 12 Drawing Sheets

U.S. PATENT DOCUMENTS

| | | | |
|---|---|---|---|
| 7,364,935 B2* | 4/2008 | Lung | 438/69 |
| 7,371,604 B2 | 5/2008 | Lee et al. | |
| 7,932,506 B2* | 4/2011 | Lung et al. | 257/2 |
| 8,021,966 B2* | 9/2011 | Jeong et al. | 438/482 |
| 2004/0202041 A1* | 10/2004 | Hidenori | 365/233 |
| 2005/0127349 A1* | 6/2005 | Horak et al. | 257/3 |
| 2006/0197115 A1* | 9/2006 | Toda | 257/248 |
| 2007/0080421 A1* | 4/2007 | Lee et al. | 257/486 |
| 2007/0298535 A1* | 12/2007 | Lung | 438/102 |
| 2008/0035961 A1 | 2/2008 | Chen et al. | |
| 2008/0192534 A1* | 8/2008 | Lung | 365/163 |
| 2009/0027955 A1* | 1/2009 | Koh et al. | 365/163 |
| 2009/0121208 A1* | 5/2009 | Nagashima et al. | 257/2 |
| 2009/0137112 A1* | 5/2009 | Tabata et al. | 438/631 |
| 2010/0019215 A1* | 1/2010 | Lung et al. | 257/2 |
| 2010/0019221 A1* | 1/2010 | Lung et al. | 257/5 |
| 2010/0078758 A1* | 4/2010 | Sekar et al. | 257/530 |
| 2010/0081268 A1* | 4/2010 | Schricker et al. | 438/600 |
| 2010/0259970 A1* | 10/2010 | Toda et al. | 365/148 |
| 2011/0207265 A1* | 8/2011 | Kwon et al. | 438/122 |

* cited by examiner

VARIABLE RESISTANCE MEMORY DEVICE AND METHODS OF FORMING THE SAME

CROSS-REFERENCE TO RELATED APPLICATION

This application claims priority under 35 U.S.C. §119 to Korean Patent Application No. 10-2008-0107236, filed on Oct. 30, 2008, the entire contents of which are herein incorporated by reference in their entirety.

BACKGROUND

1. Technical Field

The present disclosure relates to semiconductor memory devices and methods of forming the same, and more particularly, to variable resistance memory devices and methods of forming variable resistance memory devices.

2. Discussion of Related Art

A high read/write operation speed, nonvolatility and a low operation voltage enhance the performance of memory devices such as static random access memories (SRAM), dynamic random access memories (DRAM) and flash memories.

A unit cell of the DRAM includes one capacitor and one transistor controlling the capacitor. A unit cell of the SRAM includes six transistors. Thus, each of the unit cells of the DRAM and SRAM is larger as compared with a unit cell of a NAND flash memory. Both the DRAM and the SRAM perform a refresh operation, which is not required in the NAND flash memory, but are capable of faster operation than NAND flash memory.

A phase change random access memory (PRAM) has a high read/write operation speed, nonvolatility and a low operation voltage as compared to the DRAM, SRAM and NAND flash memory.

SUMMARY OF THE INVENTIVE CONCEPT

According to an exemplary embodiment of the present inventive concept, a method of forming a memory device comprises forming a first interlayer insulating layer on a semiconductor substrate, forming a first electrode in the first interlayer insulating layer, the first electrode having a top surface of a rectangular shape extending in a first direction, and forming a variable resistance pattern on the first electrode, the variable resistance pattern having a bottom surface of a rectangular shape extending in a second direction crossing the first direction, the bottom surface of the variable resistance pattern contacting the first electrode, wherein the area of contact between the lower electrode and the variable resistance pattern is substantially equal to a multiplication of a minor axis length of a top surface of the first electrode and a minor axis length of a bottom surface of the variable resistance pattern.

Forming the variable resistance pattern may comprises forming a first insulating layer covering the first electrode on the first interlayer insulating layer, patterning the first insulating layer to form a first trench extending in the second direction, forming a spacer extending in the second direction on a sidewall of the first trench, forming a second insulating layer to fill the first trench including the spacer, removing the spacer to form a first groove, and forming a variable resistance layer to fill the first groove.

A plurality of the first electrodes can be disposed in the first interlayer insulating layer.

The variable resistance pattern may contact the first electrodes arranged along the second direction.

A plurality of the first electrodes can be disposed in the first interlayer insulating layer.

The plurality of variable resistance patterns may contact the plurality of first electrodes respectively.

The plurality of variable resistance patterns can be spaced apart from each other.

The spacer may comprise a material having an etching selectivity with respect to the first insulating layer and the second insulating layer.

The spacer may comprise a silicon oxide layer and the first and second insulating layers may comprise a silicon nitride layer.

At least an upper portion of the first interlayer insulating layer may comprise a silicon nitride layer.

Forming the variable resistance pattern may further comprise performing a planarization process to remove an upper portion of the spacer.

Forming the variable resistance pattern may further comprise performing a planarization process on the variable resistance layer to expose the first and second insulating layers.

The method may further comprise forming a second electrode on the variable resistance pattern.

According to an exemplary embodiment of the present inventive concept, a memory device comprises a first interlayer insulating layer disposed on a semiconductor substrate, a first electrode disposed in the first interlayer insulating layer, the first electrode having a top surface of a rectangular shape extending in a first direction, a second interlayer insulating layer disposed on the first interlayer insulating layer, a variable resistance pattern disposed on the second interlayer insulating layer, the variable resistance pattern having a bottom surface of a rectangular shape extending in a second direction crossing the first direction, the bottom surface of the variable resistance pattern contacting the first electrode, wherein the area of contact between the lower electrode and the variable resistance pattern is substantially equal to a multiplication of a minor axis length of a top surface of the first electrode and a minor axis length of a bottom surface of the variable resistance pattern.

The memory device may further comprise a second electrode disposed on the variable resistance pattern.

According to an exemplary embodiment of the present inventive concept, a memory device comprises a substrate, a conductive line disposed on the substrate, an insulating layer disposed on the substrate and the conductive line, a diode disposed in the insulating layer and contacting the conductive line, a first interlayer insulating layer disposed on the insulating layer, a second interlayer insulating layer disposed on the first interlayer insulating layer, a first electrode disposed in the first insulating layer, a resistance pattern disposed in the second insulating layer and contacting the first electrode, and a second electrode disposed on the second insulating layer and contacting the resistance pattern.

A contact area of the first electrode and the resistance pattern can be a substantially rectangular shape.

BRIEF DESCRIPTION OF THE DRAWINGS

Exemplary embodiments of the present inventive concept will be more clearly understood from the following detailed description taken in conjunction with the accompanying drawings in which.

DETAILED DESCRIPTION OF EXEMPLARY EMBODIMENTS

Figure 1:
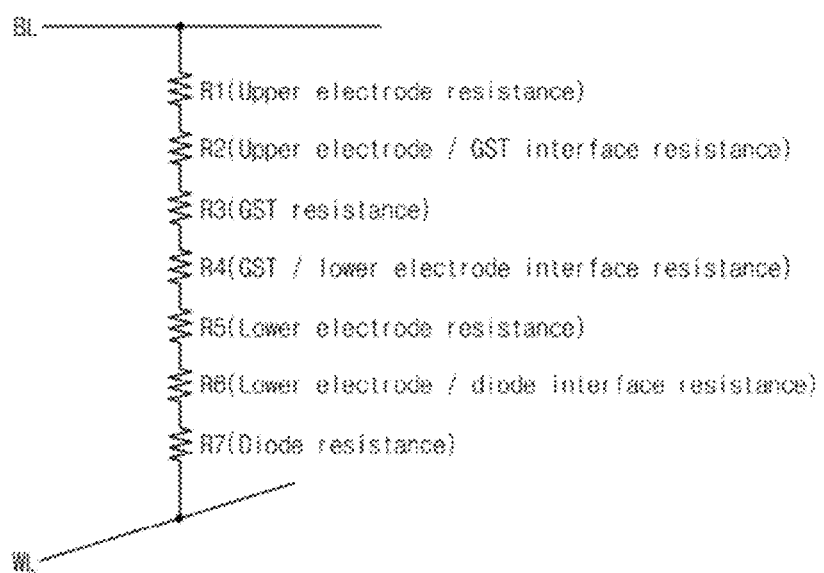
FIG. 1 shows a connection of resistors in a variable resistance memory device.

The present inventive concept now will be described more fully hereinafter with reference to the accompanying drawings, in which embodiments of the inventive concept are shown. This inventive concept may, however, be embodied in many different forms and should not be construed as limited to the embodiments set forth herein.

It will be understood that when an element is referred to as being "connected" or "coupled" to another element, it can be directly connected or coupled to the other element or intervening elements may be present.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

It will also be understood that when an element such as a layer, region or substrate is referred to as being "on" or "onto" another element, it may lie directly on the other element or intervening elements or layers may also be present.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

A variable resistance memory device according to an exemplary embodiment of the present inventive concept may include a phase change random access memory (PRAM).

Data stored in a unit cell of the PRAM can be decoded by sensing an electric resistance change according to a change of a state of a phase change layer. The state of the phase change layer depends on a heating temperature and a heating time of the phase change layer. The state of the phase change layer can be determined by a current flowing through the PRAM and the amount of heat generated by the current flow, represented by the Joule's law as shown below.

$$Q = I^2 R t \qquad \text{[formula 1]}$$

Here, the resistance (R) is a fixed parameter depending on the material used and the manufacturing process. The time (t) and the current (I) are externally controllable parameters for an operation of a manufactured device. Increasing a resistance of a portion heating the phase change layer causes the phase change layer to reach a required temperature.

FIG. 1 shows a connection of resistors in a variable resistance memory device. An electric resistance of a conductive line is in proportion to a resistivity and a length of a conductive line. The electric resistance of a conductive line is in inverse proportion to a cross sectional area of a conductive line. Accordingly, reducing the cross sectional area of a lower electrode increases a resistance of the lower electrode.

A method for reducing a cross sectional area of the lower electrode includes reducing a cross sectional area of an upper region of the lower electrode contacting a phase change pattern (GST) and reducing a cross sectional area of a lower region of the lower electrode which does not contribute to a heating of the phase change pattern (GST). As a result, the method of reducing a cross sectional area of the lower electrode may increase a resistance of an intended location (e.g., an interface resistance (R4) between a phase change pattern and a lower electrode) and a resistance of an unintended location (e.g., a lower electrode resistance (R5) and an interface resistance (R6) between a lower electrode and a diode). An increase of a resistance of a region which does not contribute to a heating of the phase change pattern (GST) causes an increase of a consumption power and a degradation of reliability. Selectively increasing the interface resistance (R4) between a phase change pattern (GST) and a lower electrode while minimizing unintended other resistances can prevent the increase of a consumption power and a degradation of reliability.

FIGS. 2A through 2E show a method of forming a variable resistance memory device according to an exemplary embodiment of the present inventive concept.

Figure 2A:
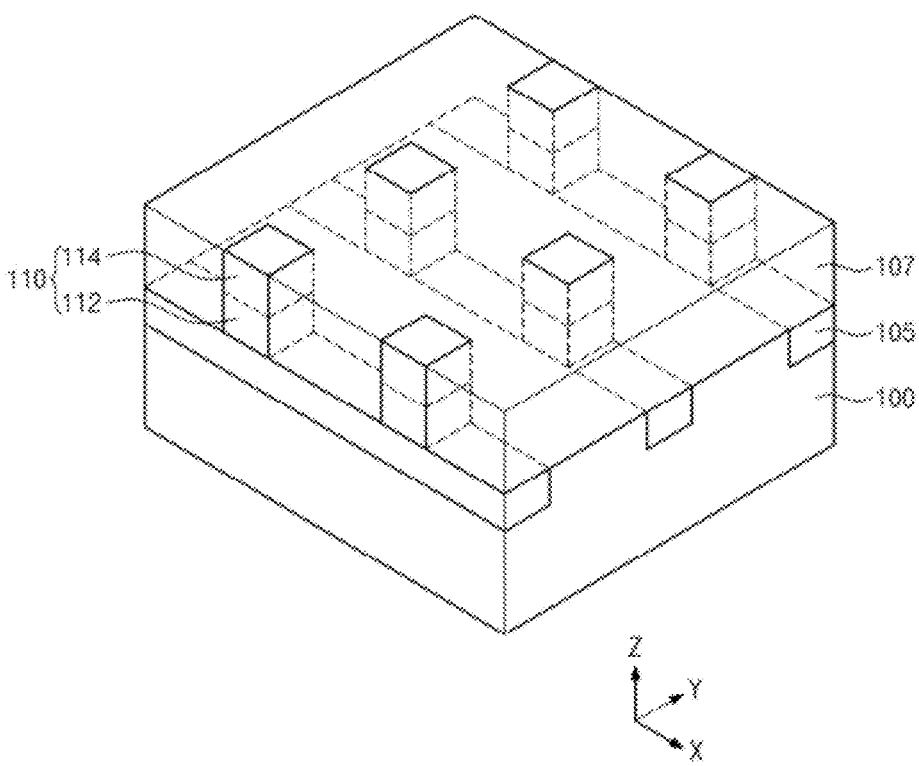
FIGS. 2A through 2E show a method of forming a variable resistance memory device according to an exemplary embodiment of the present inventive concept.

Referring to FIG. 2A, lower conductive lines 105 extending in a first direction are formed in a semiconductor substrate 100. The first direction is an x direction as shown in FIG. 2A. When a conductivity type of the semiconductor substrate 100 is a p-type, a conductivity type of the lower conductive lines 105 may be $n^+$ type. The lower conductive lines 105 may include metal. A lower insulating layer 107 is formed on the semiconductor substrate 100. The lower insulating layer 107 may comprise a silicon oxide layer. The lower conductive lines 105 may be word lines connecting variable resistance memory cells in a predetermined direction.

Diodes 110 connected to the lower conductive lines 105 are formed in the lower insulating layer 107. A method of foaming the diode 110 may include forming a hole region in the lower insulating layer 107 and performing an epitaxial process using the lower conductive line 105 as a seed layer. The diode 110 may include a lower doping region 112 and an upper doping region 114 that are sequentially stacked on the lower conductive line 105. The lower doping region 112 contacts a top surface of the lower conductive line 105. The lower doping region 112 may comprise the same conductivity type as the lower conductive line 105, and the upper doping region 114 may comprise a different conductivity type from the lower conductive line 105.

Figure 2B:
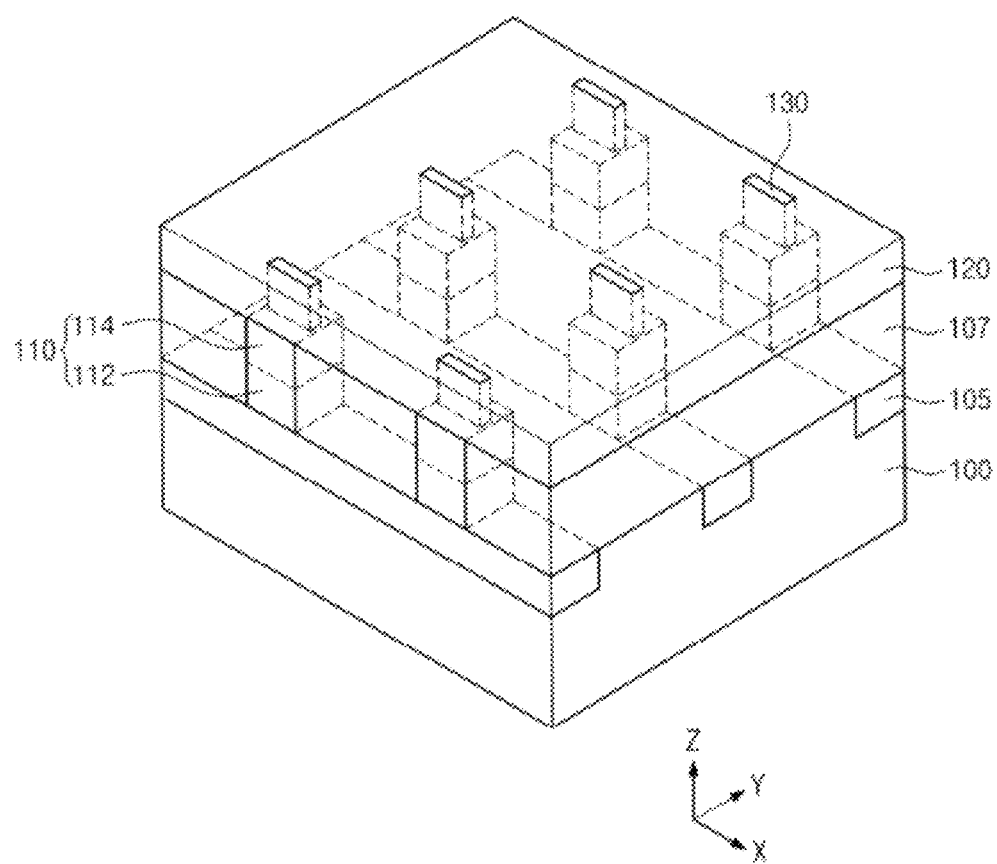

Referring to FIG. 2B, a first interlayer insulating layer 120 is formed on the lower insulating layer 107. At least an upper portion of the first interlayer insulating layer 120 may comprise a silicon nitride layer. A plurality of lower electrodes 130 are formed in the first interlayer insulating layer 120. The lower electrodes 130 may have top surfaces of a rectangular shape extending in the first direction.

A method of forming the lower electrodes 130 may include forming a via hole arranged in the first interlayer insulating layer 120, depositing a lower electrode layer filling the via hole, and planarizing the lower electrode layer to expose the first interlayer insulating layer 120.

The lower electrodes 130 may comprise nitrides or oxynitrides respectively including a metal element. The metal element may include carbon (C), titanium (Ti), tantalum (Ta), aluminum titanium (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), tungsten titanium (TiW) or tungsten silicide (WSix). In an exemplary embodiment, nitrides including a metal element may include TiN, TaN, WN, MoN, NbN, TiSiN, TiAlN, TiBN, ZrSiN, WSiN, WBN, ZrAlN, MoSiN, MoAlN, TaSiN or TaAlN. Oxynitrides including a metal element may include TiON, TiAlON, WON, or TaON. According to an exemplary embodiment, the lower electrodes 130 may comprise a titanium nitride layer.

Figure 2C:
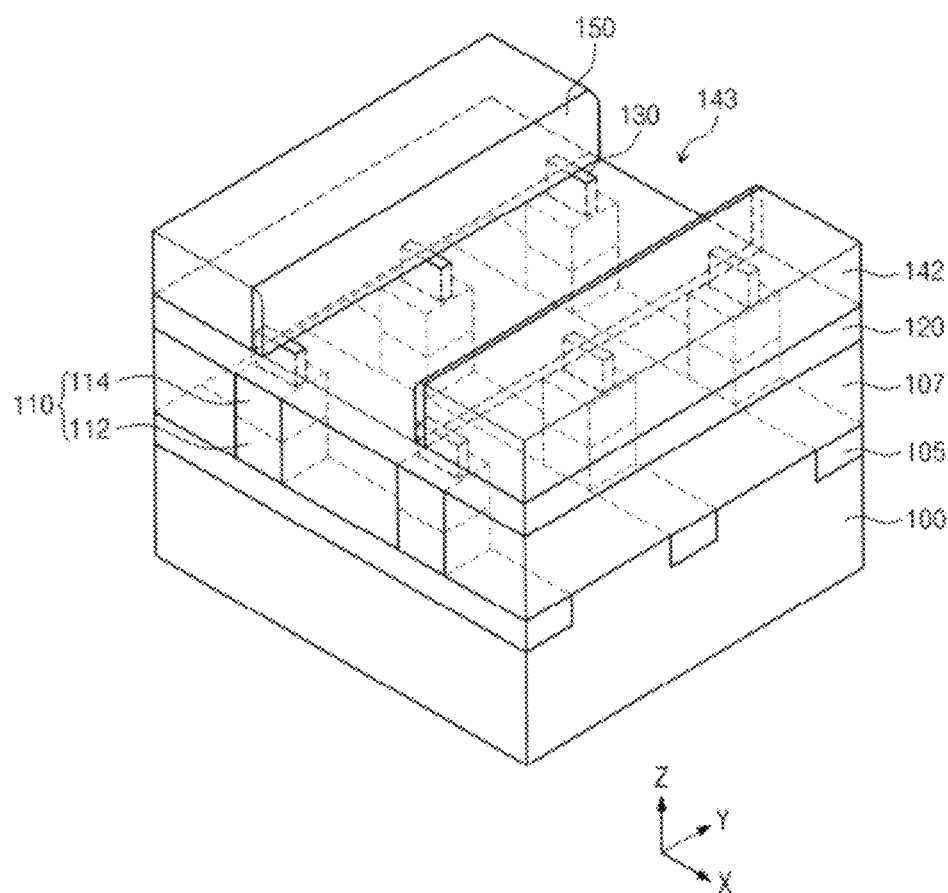

Referring to FIG. 2C, a first insulating layer 142 is formed on the first interlayer insulating layer 120. The first insulating layer 142 may comprise a material which has an etch selectivity with respect to the first interlayer insulating layer 120. Preferably, the first insulating layer 142 may comprise a silicon oxide layer. The first insulating layer 142 is patterned to form a first trench 143 extending in a second direction. The second direction is a y direction. The x and y directions are parallel to a surface of the semiconductor substrate 100 and a z direction is perpendicular to a surface of the semiconductor substrate 100. A spacer 150 is formed on a sidewall of the first insulating layer 142 including the first trench 143. The spacer 150 may comprise a material which has an etch selectivity with respect to the first interlayer insulating layer 120, the first insulating layer 142 and lower electrode. Furthermore, the spacer 150 may comprise a material which is not etched by an etchant or etching gas containing fluorine atom. In a subsequent process, if the spacer is etched using the etchant or etching gas containing fluorine atom, the fluorine atom can react with a metal atom such as Ti of the lower electrode 130, thereby forming a byproduct such as $TiF_x$ polymer. It is difficult to remove the $TiF_x$ polymer. Furthermore, the $TiF_x$ polymer increase a contact resistance between the lower electrode 130 and a variable resistance pattern 160 (which is illustrated in FIG. 2E). Preferably, the spacer 150 may comprise silicon or a chalcogen compound including at least one of antimony (Sb), tellurium (Te) and germanium (Ge). For example, if the spacer 150 is formed of Si, the spacer 150 can be removed by only a chlorine gas ($Cl_2$), thereby not forming the $TiF_x$ polymer. Furthermore, the chlorine gas etching (or removing) the spacer 150 foamed of Si can remove a top portion of the lower electrode 130 which may have been etch-damaged, thereby improving a contact resistance between the lower electrode 130 and a variable resistance pattern 160 (which is illustrated in FIG. 2E). The spacer 150 may extend in the second direction to contact the lower electrodes 130. A method of forming the spacer 150 may include forming a preliminary spacer layer on an entire surface of the first insulating layer 142 including the first trench 143, and then performing an anisotropic etching process on the preliminary spacer layer.

Figure 2D:
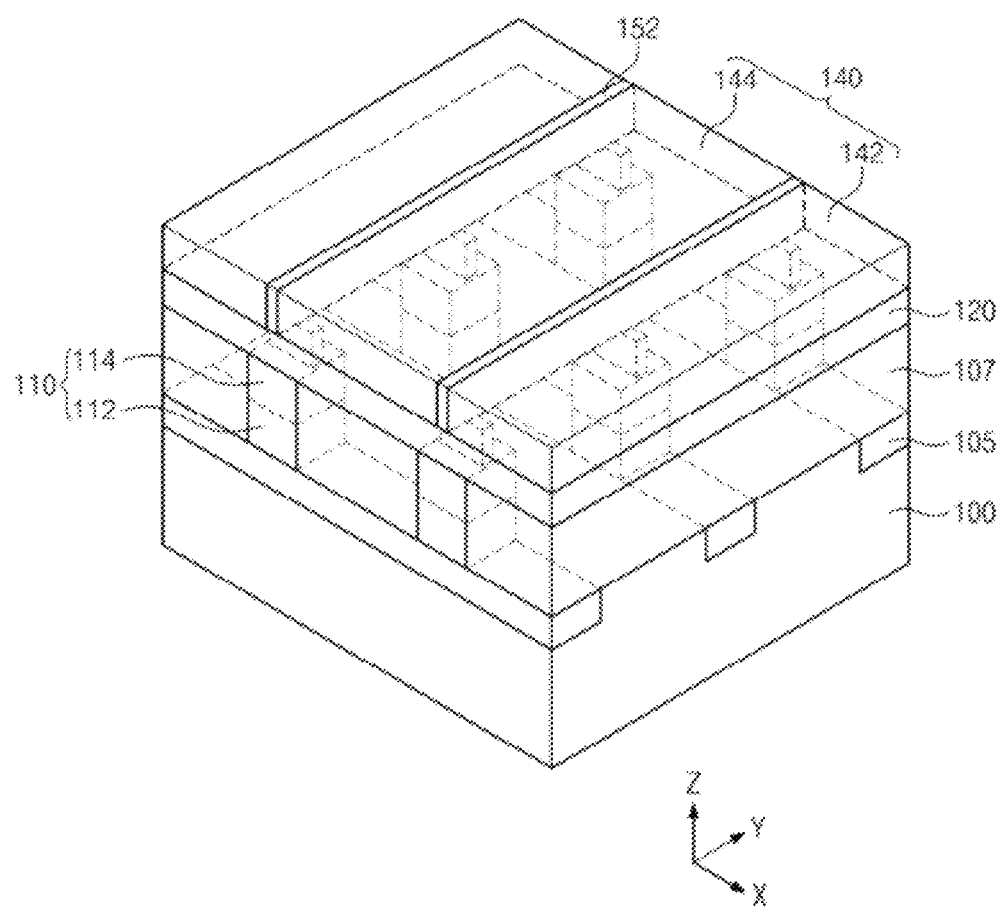
Figure 2E:
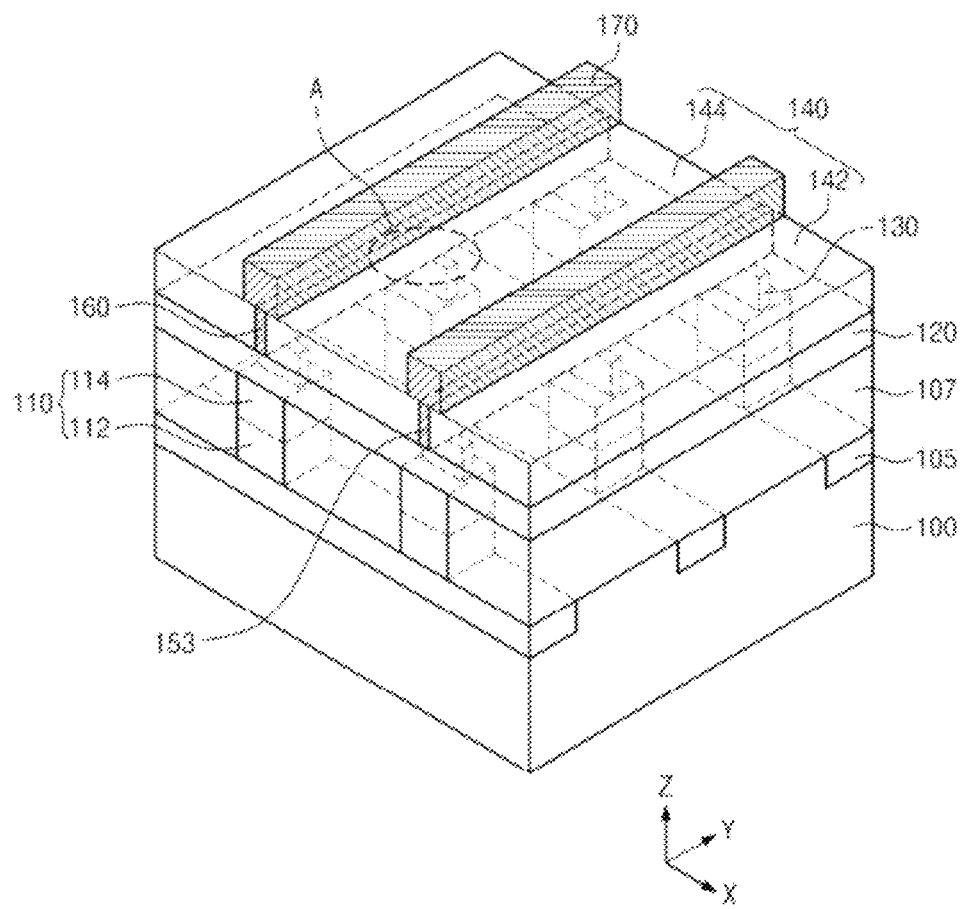

Referring to FIG. 2D, a second insulating layer 144 filling the first trench 143 including the spacer 150 is formed. The second insulating layer 144 may comprise the same material as the first insulating layer 142. The first insulating layer 142 and the second insulating layer 144 may constitute a second interlayer insulating layer 140. A method of forming the second insulating layer 144 may include forming an insulating layer filling the first trench 143 and covering the first insulating layer 142, and performing a planarization process removing an upper portion of the spacer 150. A sacrificial spacer 152 can be formed by patterning the spacer 150 in the planarization process. The sacrificial spacer 152 may have a vertical section of a rectangular shape.

Referring to FIG. 2E, the sacrificial spacer 152 is removed to form a first groove 153. The sacrificial spacer 152 may have an etching selectivity with respect to the first and second insulating layers 142 and 144. Here, layer a has an etching selectivity with respect to layer b may indicate that maximizing an etching of layer a while minimizing an etching of layer b or vice versa. The sacrificial spacer 152 may comprise a silicon oxide layer and the first and second insulating layers 142 and 144 may comprise a silicon nitride layer. The sacrificial spacer 152 may be removed using an etching solution including, for example, hydrofluoric acid (HF). The sacrificial spacer 152 may have an etching selectivity with respect to the first interlayer insulating layer 107. At least an upper portion of the first interlayer insulating layer 107 may comprise a silicon nitride layer. Thus, when removing the sacrificial spacer 152, an upper portion of the lower electrode 130 may not be exposed except a top surface of the lower electrode 130.

Figure 3:
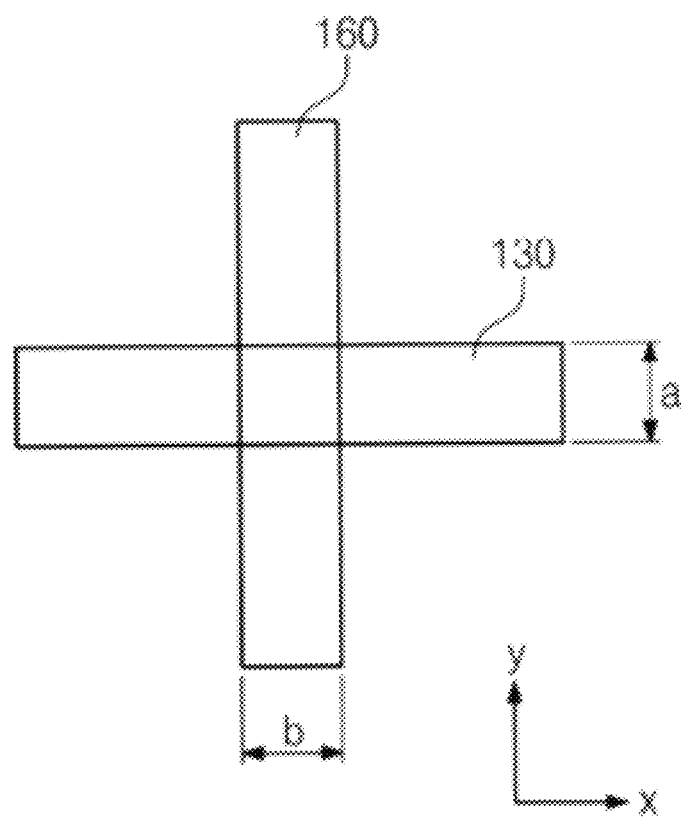
FIG. 3 shows a contact area of a variable resistance pattern and a lower electrode according to an exemplary embodiment of the present inventive concept.

A variable resistance pattern 160 filling the first groove 153 is formed. The variable resistance pattern 160 may contact the lower electrodes 130 arranged in the second direction. Referring to FIG. 3, an area that the lower electrode 130 contacts the variable resistance pattern 160 may be represented as a multiple of a minor axis length (a) of a top surface of the lower electrode 130 and a minor axis length (b) of a bottom surface of the variable resistance pattern 160. A top surface of the lower electrode 130 and a bottom surface of the variable resistance pattern 160 may have a rectangular shape and may have respective major axis lengths and minor axis lengths. A method of forming the variable resistance pattern 160 may include forming a variable resistance layer filling the first groove and planarizing the variable resistance layer to expose the first and second insulating layers 142 and 144.

A profile of the variable resistance pattern 160 may be determined by a profile of the sacrificial spacer 152. According to an exemplary embodiment of the present inventive concept, a profile of the variable resistance pattern 160 may be determined by a gradient of a sidewall of the first trench 143 and a step coverage of the preliminary spacer layer when a process of forming the sacrificial spacer 152 is performed.

When the variable resistance pattern 160 is a phase change material, the variable resistance pattern 160 may comprise a chalcogen compound including at least one of antimony (Sb), tellurium (Te) or selenium (Se). For example, the variable resistance pattern 160 may be $Ge_{22}Sb_{22}Te_{56}$ including antimony (Sb), tellurium (Te) and selenium (Se). In an exemplary embodiment, $Ge_{22}Sb_{22}Te_{56}$ may include tellurium (Te) having a concentration of about 20 atom percent to about 80 atom percent, antimony (Sb) having a concentration of about 5 atom percent to about 50 atom percent, and germanium (Ge) having the rest of the proportion.

An upper electrode 170 electrically connected to the variable resistance pattern 160 and extending in the second direction is formed on the second interlayer insulating layer 140.

The upper electrode 170 may comprise nitrides or oxynitrides respectively including a metal element such as, for example, carbon (C), titanium (Ti), tantalum (Ta), aluminum titanium (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), tungsten titanium (TiW) or tungsten silicide (WSix). In an exemplary embodiment, nitrides including a metal element may include TiN, TaN, WN, MoN, NbN, TiSiN, TiAlN, TiBN, ZrSiN, WSiN, WBN, ZrAlN, MoSIN, MoAlN, TaSiN or TaAlN. Oxynitrides including metal element may include, for example, TiON, TiAlON, WON, or TaON. According to an exemplary embodiment, the upper electrode 170 may comprise a titanium nitride layer.

According to an exemplary embodiment of the present inventive concept, the variable resistance pattern 160 contacts the lower electrode 130 extending in the second direction. The interface resistance (R4) between the variable resistance pattern 160 and the lower electrode 130 can be selectively increased by minimizing a contact area of the lower electrode 130 and the variable resistance pattern 160. An increase of power consumption and a degradation of reliability of a device can be prevented by maintaining and/or reducing a resistance of a region (e.g., the lower electrode resistance (R5)) which does not contribute to a heating of the variable resistance pattern 160.

Figure 4A:
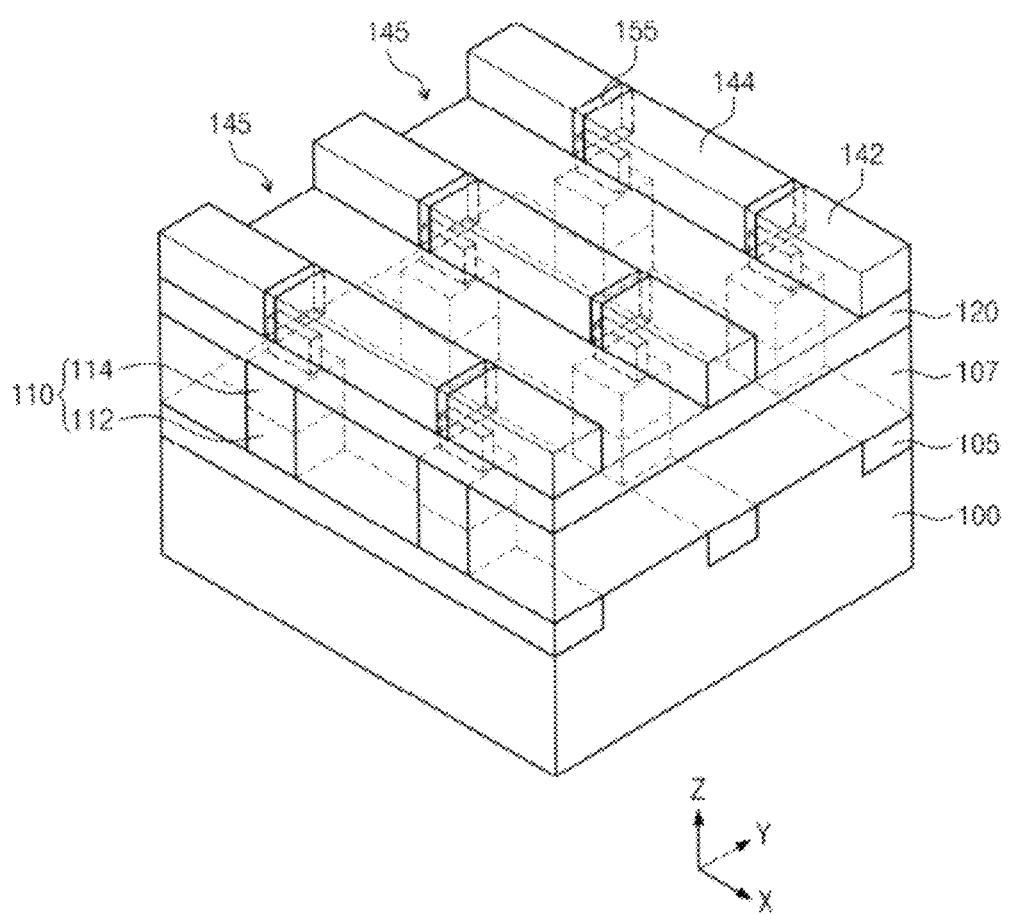
FIGS. 4A and 4B show a method of forming a variable resistance memory device according to an exemplary embodiment of the present inventive concept.
Figure 4B:
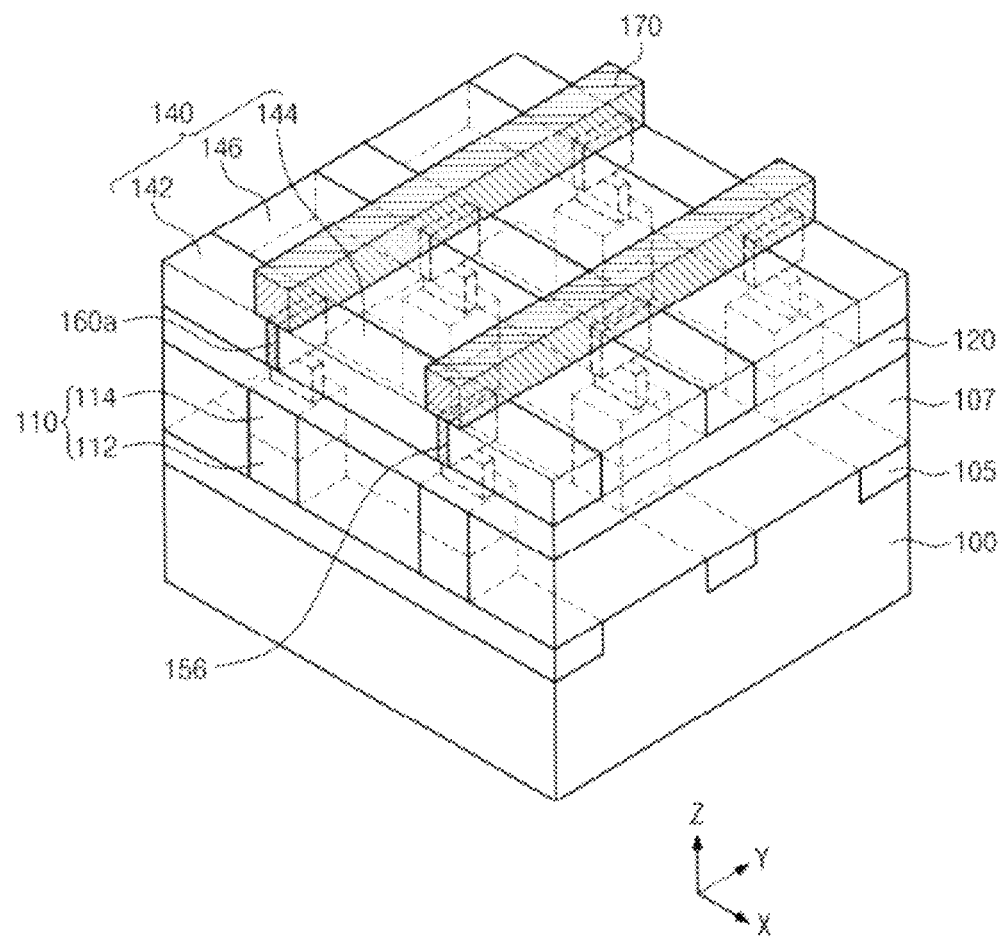

Referring to FIGS. 4A and 4B, a method of forming a variable resistance memory device according to an exemplary embodiment is described.

Referring to FIGS. 2D and 4A, after forming the sacrificial spacer 152, a second trench 145 extending in the first direction is formed. A method of forming the second trench 145 may include patterning the sacrificial spacer 152 to separate the sacrificial spacer 152. As a result, a spacer pattern 155 is formed. The spacer pattern 155 may have a bottom surface of a rectangular shape extending in the second direction. The spacer pattern 155 may contact the lower electrode 130.

Referring to FIGS. 3 and 4B, a third insulating layer 146 filling the second trench 145 is formed. The third insulating layer 146 may comprise the same material as the first and second insulating layers 142 and 144. The first, second and third insulating layers 142, 144 and 146 may constitute a second interlayer insulating layer 140. The spacer pattern 155 is removed to form a second groove 156. The spacer pattern 155 may have an etching selectivity with respect to the second interlayer insulating pattern 140. A variable resistance pattern 160a filling the second groove 156 is formed. The variable resistance pattern 160a may be formed using a substantially same method as the variable resistance pattern 160 described above. An upper electrode 170 contacts a plurality of the variable resistance patterns 160a in the second direction. An area that the variable resistance pattern 160a contacts the lower electrode 130 may be represented as a multiple of a minor axis length (a) of a top surface of the lower electrode 130 and a minor axis length (b) of bottom surface of the variable resistance pattern 160a.

According to an exemplary embodiment of the present inventive concept, the interface resistance (R4) between the lower electrode 130 and the variable resistance pattern described in FIG. 1 can be selectively increased by minimizing an area that the lower electrode 130 contacts the variable resistance pattern 160a. The variable resistance pattern 160a can be surrounded by the first and second interlayer insulating layers 120 and 140. The first and second interlayer insulating layers 120 and 140 comprise an insulating layer having a low thermal conductivity (e.g., a silicon nitride layer) to prevent heat from radiating when heating the variable resistance pattern 160a. Thus, a consumption of current in the variable resistance memory device may be reduced.

Figure 5:
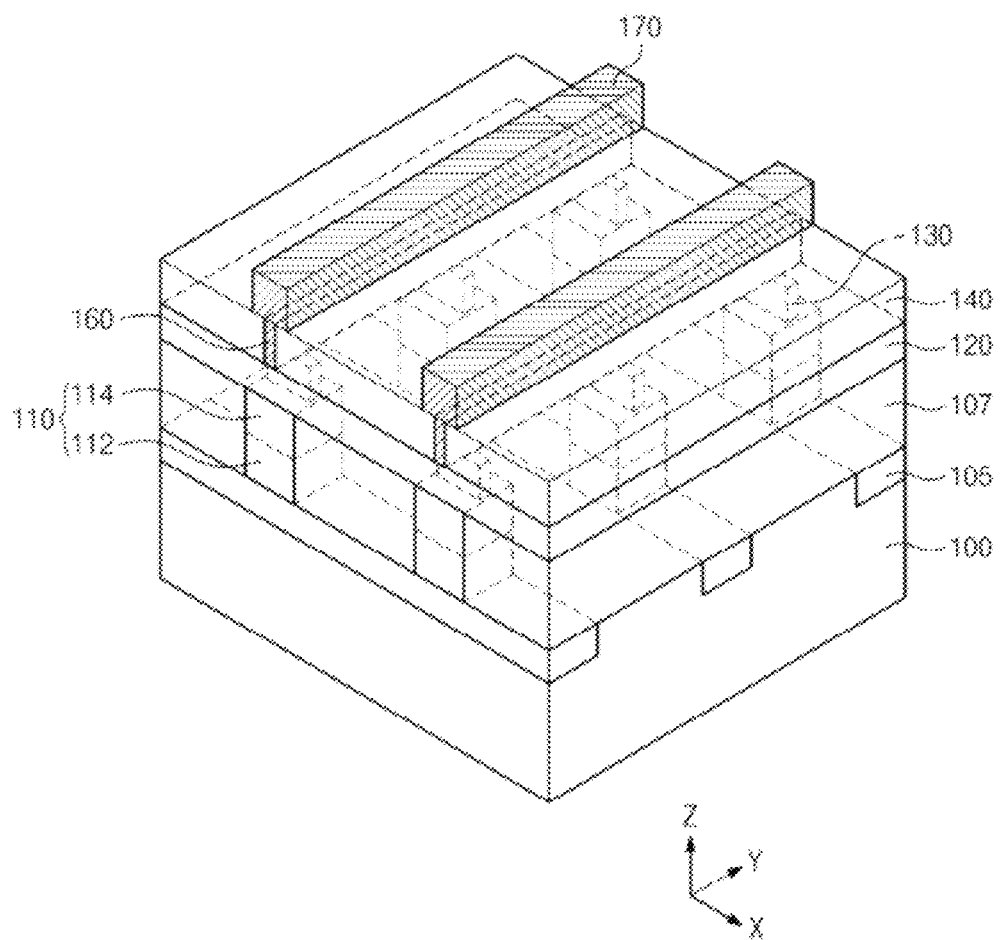
FIG. 5 shows a variable resistance memory device according to an exemplary embodiment of the present inventive concept.

FIG. 5 shows a variable resistance memory device according to an exemplary embodiment of the present inventive concept.

Referring to FIG. 5, lower conductive lines 105 extending in the first direction are disposed in the semiconductor substrate 100. When a conductivity type of the semiconductor substrate 100 is a p-type, a conductivity type of the lower conductive lines 105 may be $n^+$ type. The lower conductive lines 105 may be word lines of variable resistance memory cells.

A lower insulating layer 107 is disposed on the semiconductor substrate 100. The lower insulating layer 107 may include a silicon oxide layer. Diodes 110 are disposed and contact the lower conductive lines 105. The diodes 110 are formed in the lower insulating layer 107. The diodes 110 may include a lower doping region 112 and an upper doping region 114 that are sequentially stacked on the lower conductive lines 105. The lower doping region 112 may be formed of the same conductivity type as the lower conductive line 105 and the upper doping region 114 may be formed of a different conductivity type from the lower conductive line 105.

A first interlayer insulating layer 120 is disposed on the lower insulating layer 107. At least an upper portion of the first interlayer insulating layer 120 may include a silicon nitride layer. A plurality of lower electrodes 130 are disposed on the first interlayer insulating layer 120 and contact the diode 110. The lower electrode 130 may have a top surface of a rectangular shape extending in the first direction. The lower electrode 130 may function as a heater supplying heat for a phase change of a variable resistance memory device.

The lower electrodes 130 may comprise nitrides or oxynitrides including a metal element. An example of the metal element includes carbon (C), titanium (Ti), tantalum (Ta), aluminum titanium (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), tungsten titanium (TiW) or tungsten silicide (WSix). In an exemplary embodiment, the nitrides including a metal element may include TiN, TaN, WN, MoN, NbN, TiSiN, TiAlN, TiBN, ZrSiN, WSiN, WBN, ZrAlN, MoSIN, MoAlN, TaSiN or TaAlN. In an exemplary embodiment, oxynitrides including a metal element may include TiON, TiAlON, WON, or TaON. According to an exemplary embodiment, the lower electrodes 130 may comprise a titanium nitride layer.

A second interlayer insulating layer 140 is disposed on the first interlayer insulating layer 120. The second interlayer insulating layer 140 may include a silicon nitride layer. A variable resistance pattern 160 extending in the second direction is disposed in the second interlayer insulating layer 140. The variable resistance pattern 160 may contact the lower electrodes 130 arranged along the second direction. An area that the lower electrode 130 contacts the variable resistance pattern 160 may be represented as a multiple of a minor axis length (a) of a top surface of the lower electrode 130 and a minor axis length (b) of bottom surface of the variable resistance pattern 160. A resistance (e.g., R4 in FIG. 1) for a phase change can be increased by minimizing an area that the lower electrode 130 contacts the variable resistance pattern 160. In an exemplary embodiment, a resistance of the lower electrode 130 and a resistance of the variable resistance pattern 160 (R5 and R3 in FIG. 1) cannot be increased.

When the variable resistance pattern 160 is a phase change material, the variable resistance pattern 160 may comprise a chalcogen compound. The chalcogen compound may include at least one of antimony (Sb), tellurium (Te) or selenium (Se). For example, the variable resistance pattern 160 may be $Ge_{22}Sb_{22}Te_{56}$ including antimony (Sb), tellurium (Te) and selenium (Se). In an exemplary embodiment, $Ge_{22}Sb_{22}Te_{56}$ may include tellurium (Te) having a concentration of about 20 atom percent to about 80 atom percent, antimony (Sb) having a concentration of about 5 atom percent to about 50 atom percent, and germanium (Ge) having the rest of the proportion.

An upper electrode 170 electrically connected to the variable resistance pattern 160 and extends in the second direction is formed on the second interlayer insulating layer 140. The upper electrode 170 may comprise nitrides or oxynitrides respectively including a metal element. The metal element can be, for example, carbon (C), titanium (Ti), tantalum (Ta), aluminum titanium (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), tungsten titanium (TiW) or tungsten silicide (WSix). In an exemplary embodiment, nitrides including a metal element may include TiN, TaN, WN, MoN, NbN, TiSiN, TiAlN, TiBN, ZrSiN, WSiN, WBN, ZrAlN, MoSiN, MoAlN, TaSiN or TaAlN. In an exemplary embodiment, oxynitrides including a metal element may include TiON, TiAlON, WON, or TaON. According to an exemplary embodiment, the upper electrode 170 may comprise a titanium nitride layer.

According to an exemplary embodiment of the present inventive concept, an interface resistance between the variable resistance pattern 160 and the lower electrode 130 can be selectively increased. In an exemplary embodiment, a resistance of a region in the lower electrode 130 and the variable resistance pattern 160 which is not used to increase the interface resistance is not increased. Accordingly, a current for a phase change of the variable resistance pattern 160 may be reduced and a power consumption of a device may be reduced.

Figure 6:
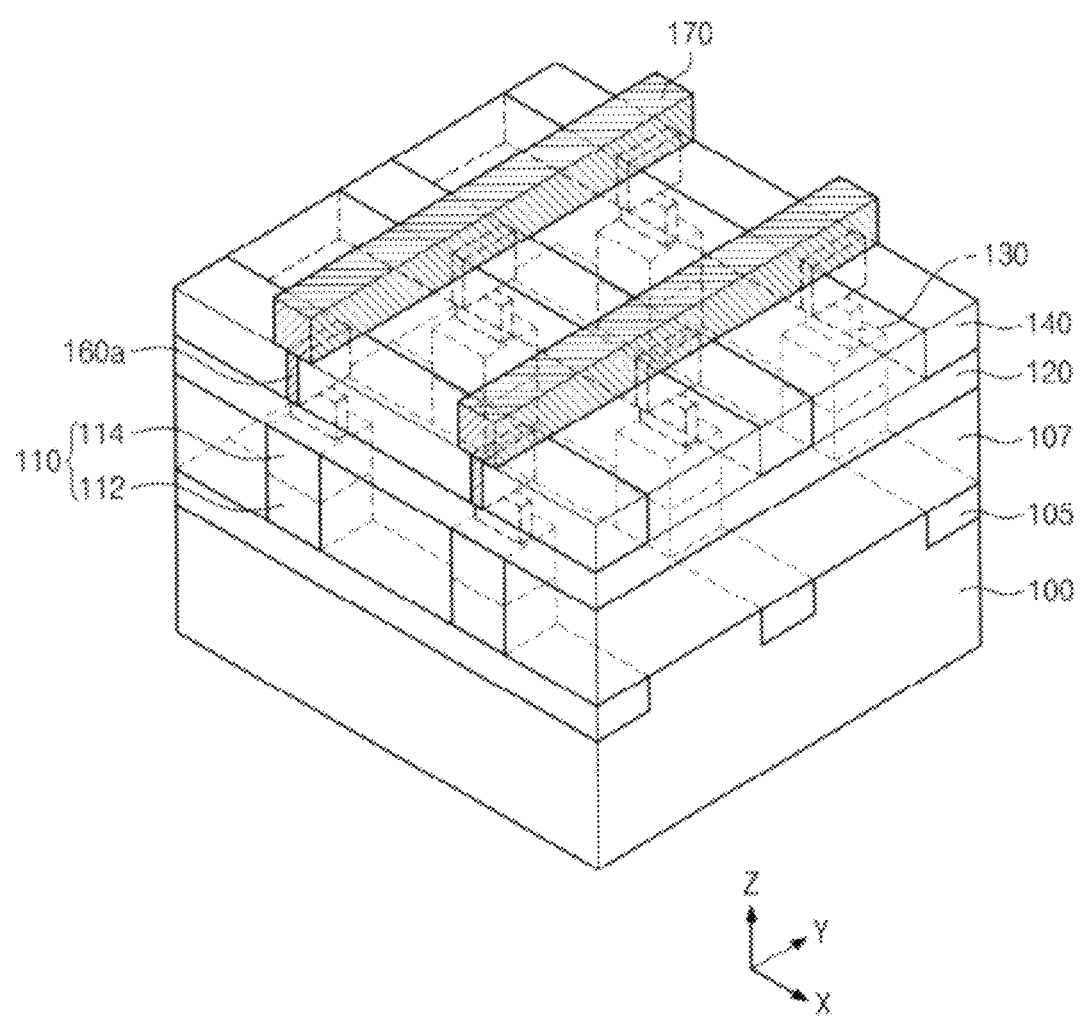
FIG. 6 shows a variable resistance memory device according to an exemplary embodiment of the present inventive concept.

Referring to FIG. 6, a method of forming a variable resistance memory device according to an exemplary embodiment is described.

Variable resistance patterns 160a contact the lower electrodes 130 and are disposed on the second interlayer insulating layer 140. The second interlayer insulating layer 140 may include a silicon nitride layer. In an exemplary embodiment, at least an upper portion of the first interlayer insulating layer 120 may include a silicon nitride layer. The variable resistance patterns 160a respectively contact the lower electrodes 130. That is, the variable resistance patterns 160a are spaced apart from each other and are disposed to correspond one on one to the lower electrodes 130. An area that the lower electrode 130 contacts the variable resistance pattern 160 may be a multiple of a minor axis length (a) of a top surface of the lower electrode 130 and a minor axis length (b) of bottom surface of the variable resistance pattern 160. A resistance (e.g., R4 in FIG. 1) for a phase change can be increased by minimizing an area that the lower electrode 130 contacts the variable resistance pattern 160. In an exemplary embodiment, a resistance of the lower electrode 130 and a resistance of the variable resistance pattern 160 (e.g., R5 and R3 in FIG. 1) are not increased.

According to an exemplary embodiment of the present inventive concept, the variable resistance patterns 160a correspond one on one to the lower electrodes 130 and are spaced apart from each other. The interface resistance between the lower electrode 130 and the variable resistance pattern 160a can be increased by minimizing an area that the lower electrode 130 contacts the variable resistance pattern 160a. In an exemplary embodiment, at least an upper portion of the first interlayer insulating layer 120 and the second interlayer insulating layer 140 may include a silicon nitride layer having a low thermal conductivity. Since the variable resistance pattern 160a is surrounded by an insulating layer having a low thermal conductivity, a heat radiation can be prevented when heating the variable resistance pattern 160a. Accordingly, power consumption and a reset current of a variable resistance memory device are reduced.

Figure 7:
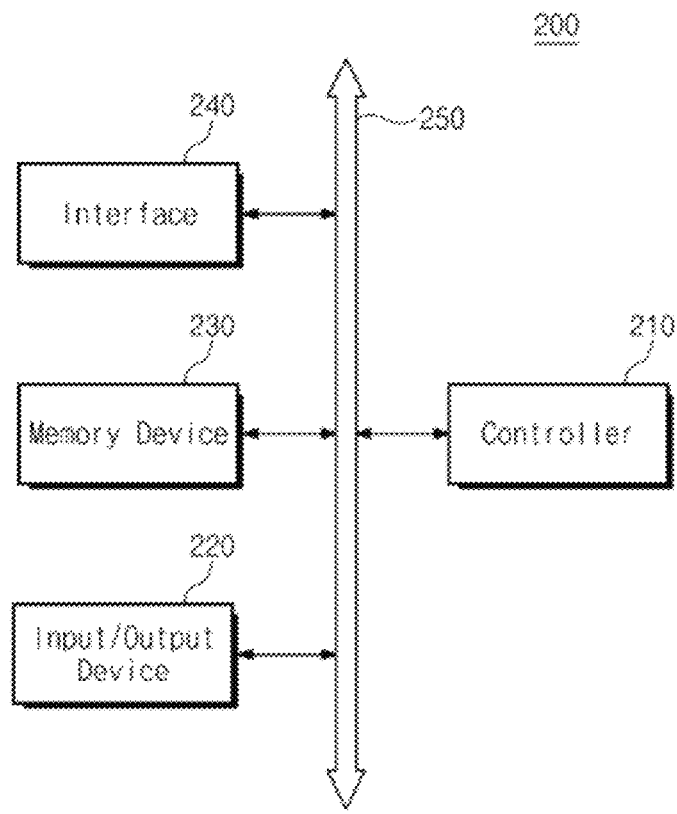
FIG. 7 is a block diagram of an electronic system including a variable resistance memory device according to an exemplary embodiment of the present inventive concept.

FIG. 7 is a block diagram of an electronic system including a variable resistance memory device according to embodiments of the present inventive concept.

Referring to FIG. 7, an electronic system 200 may include a controller 210, an input/output device 220 and a memory device 230. The controller 210, the input/output device 220 and the memory device 230 may couple to one another through a bus 250. The bus 250 may be a path through which data transfer. The controller 210 may include at least one of a microprocessor, a digital signal processor, a microcontroller and a logic device having a function similar to the microprocessor, the digital signal processor, and the microcontroller. The input/output device 220 may include at least one selected from a keypad, a keyboard and a display device. The memory device 230 is a device storing data. The memory device 230 may store data and/or an instruction executed by the controller 210. The memory device 230 may include a variable resistance memory device formed according to an exemplary embodiment of the present inventive concept. The electronic system 200 may further include an interface 240 for transmitting data to a communication network or receiving data from a communication network. The interface 240 may be a wireline/wireless type. The interface 240 may include an antenna or a wireline/wireless transceiver.

The electronic system 200 may be embodied by a mobile system, a personnel computer, an industrial computer or a logic system performing a variety of functions. For example, the mobile system may be a personal digital assistant (PDA), a portable computer, a web tablet, a mobile phone, a wireless phone, a laptop computer, a memory card, a digital music system and a data transmission/receipt system. When the electronic system 200 is a device which can perform a wireless communication, the electronic system 200 may be used in a communication interface protocol of a third generation such as CDMA, GSM, NADC, E-TDMA and/or CDMA2000.

Figure 8:
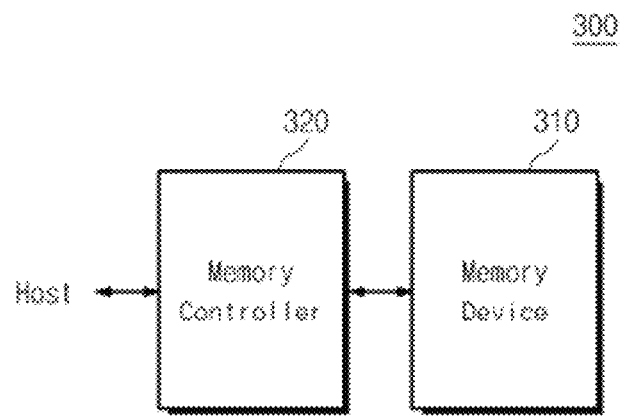
FIG. 8 is a block diagram of a memory card including a variable resistance memory device according to an exemplary embodiment of the present inventive concept.

FIG. 8 is a block diagram of a memory card including a variable resistance memory device according to exemplary embodiments of the present inventive concept.

Referring to FIG. 8, a memory card 300 may include a memory device 310 and a memory controller 320. The memory device 310 can store data. The memory device 310 may have a nonvolatile characteristic retaining its stored data when its power supply is interrupted. The memory device 310 may include a variable resistance memory device formed according to an exemplary embodiment of the present inventive concept. The memory controller 320 can readout data stored in the memory device 310 in response to a request of decoding/writing of a host or can store data in the memory device 310.

Although the exemplary embodiments of the present inventive concept have been described herein with reference to the accompanying drawings, it is to be understood that the present inventive concept should not be limited to those precise embodiments and that various other changes and modifications may be affected therein by one of ordinary skill in the related art without departing from the scope or spirit of the inventive concept. All such changes and modifications are intended to be included within the scope of the inventive concept as defined by the appended claims.

What is claimed is:

1. A method of forming a memory device comprising:
    forming a first interlayer insulating layer on a semiconductor substrate;
    forming a first electrode in the first interlayer insulating layer, the first electrode having a top surface of a rectangular shape extending in a first direction; and
    forming a variable resistance pattern on the first electrode, the variable resistance pattern having a bottom surface of a rectangular shape extending in a second direction crossing the first direction, the bottom surface of the variable resistance pattern contacting the first electrode,
    wherein the area of contact between the first electrode and the variable resistance pattern is substantially equal to a multiplication of a minor axis length of a top surface of the first electrode and a minor axis length of a bottom surface of the variable resistance pattern.

2. The method of claim 1, wherein forming the variable resistance pattern comprises:
    forming a first insulating layer covering the first electrode on the first interlayer insulating layer;
    patterning the first insulating layer to form a first trench extending in the second direction;
    forming a spacer extending in the second direction on a sidewall of the first trench;
    foaming a second insulating layer to fill the first trench including the spacer;
    removing the spacer to form a first groove; and
    forming a variable resistance layer to fill the first groove.

3. The method of claim 2, wherein the first electrode is one of a plurality of first electrodes, and the plurality of first electrodes are disposed in the first interlayer insulating layer.

4. The method of claim 3, wherein the variable resistance pattern contacts the first electrodes arranged along the second direction.

5. The method of claim 3, wherein the variable resistance pattern is one of a plurality of variable resistance patterns, and the plurality of variable resistance patterns contact the plurality of first electrodes respectively.

6. The method of claim 5, wherein the plurality of variable resistance patterns are spaced apart from each other.

7. The method of claim 2, wherein the spacer comprises a material having an etching selectivity with respect to the first insulating layer and the second insulating layer.

8. The method of claim 7, wherein the spacer comprises a silicon oxide layer and the first and second insulating layers comprise a silicon nitride layer.

9. The method of claim 7, wherein the spacer comprises silicon or a chalcogen compound including at least one of antimony (Sb), tellurium (Te) and germanium (Ge).

10. The method of claim 8, wherein at least an upper portion of the first interlayer insulating layer comprises a silicon nitride layer.

11. The method of claim 2, wherein forming the variable resistance pattern further comprises performing a planarization process to remove an upper portion of the spacer.

12. The method of claim 2, wherein forming the variable resistance pattern further comprises performing a planarization process on the variable resistance layer to expose the first and second insulating layers.

13. The method of claim 1, further comprising forming a second electrode on the variable resistance pattern.

14. A method of forming a memory device comprising:
    forming a first interlayer insulating layer on a semiconductor substrate;
    forming a first electrode in the first interlayer insulating layer and on an upper doping region of a diode, the first electrode having a top surface of a rectangular shape extending in a first direction, wherein a width of the first electrode in a second direction crossing the first direction is less than a width of the upper doping region of the diode in the second direction; and
    forming a variable resistance pattern on the first electrode, the variable resistance pattern having a bottom surface of a rectangular shape extending in the second direction, the bottom surface of the variable resistance pattern contacting the first electrode,
    wherein the area of contact between the first electrode and the variable resistance pattern is substantially equal to a multiplication of a minor axis length of a top surface of the first electrode and a minor axis length of a bottom surface of the variable resistance pattern.

15. The method of claim 14, wherein the first electrode is one of a plurality of first electrodes, and the plurality of first electrodes are disposed in the first interlayer insulating layer.

16. The method of claim 15, wherein the variable resistance pattern contacts the first electrodes arranged along the second direction.

17. The method of claim 15, wherein the variable resistance pattern is one of a plurality of variable resistance patterns, and the plurality of variable resistance patterns contact the plurality of first electrodes respectively.

18. The method of claim 17, wherein the plurality of variable resistance patterns are spaced apart from each other.

19. A method of forming a memory device comprising:
    forming a first interlayer insulating layer on a semiconductor substrate;
    forming a first electrode in the first interlayer insulating layer, the first electrode having a top surface of a rectangular shape extending in a first direction; and
    forming a variable resistance pattern on the first electrode, the variable resistance pattern having a bottom surface of a rectangular shape extending in a second direction crossing the first direction, the bottom surface of the variable resistance pattern contacting the first electrode, wherein a width of a side surface of the variable resistance pattern extending in the second direction is the same from the bottom surface of the variable resistance pattern to a top, opposing surface of the variable resistance pattern,
    wherein the area of contact between the first electrode and the variable resistance pattern is substantially equal to a multiplication of a minor axis length of a top surface of the first electrode and a minor axis length of a bottom surface of the variable resistance pattern.

20. The method of claim 19, wherein the first electrode is one of a plurality of first electrodes, and the plurality of first electrodes are disposed in the first interlayer insulating layer.

21. The method of claim 20, wherein the variable resistance pattern contacts the first electrodes arranged along the second direction.

* * * * *